United States Patent [19]
Yamagata

[11] Patent Number: 5,568,051
[45] Date of Patent: Oct. 22, 1996

[54] MAGNETIC RESONANCE IMAGING APPARATUS HAVING SUPERIMPOSED GRADIENT COIL

[75] Inventor: Hitoshi Yamagata, Tochigi-ken, Japan

[73] Assignee: Kabushiki Kaisha Toshiba, Kanagawa-ken, Japan

[21] Appl. No.: 308,968

[22] Filed: Sep. 20, 1994

Related U.S. Application Data

[63] Continuation of Ser. No. 57,571, May 6, 1993, abandoned.

[30] Foreign Application Priority Data

May 12, 1992 [JP] Japan .................... 4-119128

[51] Int. Cl.⁶ .................................. G01R 33/28
[52] U.S. Cl. ........................................ 324/318
[58] Field of Search ....................... 324/300, 307, 324/309, 310, 311, 312, 313, 314, 318, 322; 128/653.5; 335/296, 299

[56] References Cited

U.S. PATENT DOCUMENTS

| | | | |
|---|---|---|---|
| 3,643,181 | 2/1972 | Stirrat et al. | 324/300 |
| 4,165,479 | 8/1979 | Mansfield | 324/309 |
| 4,214,202 | 7/1980 | Bonori | 324/313 |
| 4,516,075 | 5/1985 | Moran | 324/309 |
| 4,733,189 | 3/1988 | Punchard et al. | 324/318 |
| 4,737,716 | 4/1988 | Roemer et al. | 324/319 |
| 4,791,370 | 12/1988 | MacKinnon | 324/318 |
| 4,794,338 | 12/1988 | Roemer et al. | 324/318 |
| 4,799,012 | 1/1989 | Hanawa | 324/309 |
| 4,812,761 | 3/1989 | Vaughan, Jr. | 324/307 |
| 4,978,920 | 12/1990 | Mansfield et al. | 324/318 |
| 5,146,197 | 9/1992 | Lowe | 324/318 |
| 5,166,699 | 11/1992 | Ries | 324/322 |
| 5,235,281 | 8/1993 | Haragashira et al. | 324/318 |
| 5,334,937 | 8/1994 | Peck et al. | 324/322 |
| 5,349,318 | 9/1994 | Inoue | 324/318 |
| 5,406,205 | 4/1995 | Muller | 324/318 |
| 5,414,360 | 5/1995 | Westphal | 324/318 |

FOREIGN PATENT DOCUMENTS 1-110354 4/1989 Japan.

Primary Examiner—Sandra L. O'Shea
Assistant Examiner—Raymond Y. Mah
Attorney, Agent, or Firm—Finnegan, Henderson, Farabow, Garrett & Dunner, L.L.P.

[57] ABSTRACT

A gradient coil system for a magnetic resonance imaging apparatus is described which has a capability of high-speed switching and high intensity for a certain pulse sequence, for example, a rapid imaging or an angiographic imaging. The gradient coil system comprises multiple coil elements which reduce a load of a gradient amplifier. Each of the coil patterns of the coil elements is formed on an individual substrate and the coil elements are radially superposed. This enables each coil turn to be wide and thin.

10 Claims, 8 Drawing Sheets

MAGNETIC RESONANCE IMAGING APPARATUS HAVING SUPERIMPOSED GRADIENT COIL

This application is a continuation of application Ser. No. 08/057,571 filed May 6, 1993, now abandoned.

BACKGROUND OF THE INVENTION

This invention relates to a magnetic resonance imaging (MRI) apparatus and, more particularly, an MRI apparatus which employs a gradient coil system to provide a gradient magnetic field.

An MRI apparatus detects magnetic resonance signals from nuclei (e.g. proton) in an object and reconstructs a tomographic image of a desired slice position of the object. An MRI apparatus holds a great advantage in medical use because of non-invasiveness or non X-ray dosing.

In some imaging methods applied to an MRI apparatus, such as a rapid imaging or an angiographic imaging, a gradient field with a great intensity is rapidly switched in an interval of several milli-seconds, for example. Such imaging methods are disclosed in, for example, U.S. Pat. No. 4,165,479, issued Aug. 21, 1979 to Mansfield or U.S. Pat. No. 4,516,075, issued May 7, 1985 to Moran. Extremely high power is required from a gradient amplifier for supplying electrical power to a gradient coil in such imaging methods.

Usui's Japanese patent application No. 62-268134 discloses a gradient coil system which enables gradient amplifiers to provide a great intensity of gradient field with less load. Usui's gradient coil system comprises a plurality of gradient coil elements respectively connected to individual gradient amplifiers.

FIG. 1 shows a gradient coil system for an MRI apparatus, which is of a type such as disclosed in Usui. A gradient coil system 1 comprises a gradient coil unit 6 including a plurality of gradient coil elements 2a to 2e and gradient amplifiers 3a to 3e respectively connected thereto.

FIG. 2A shows a developed coil pattern of the gradient coil elements 2a to 2c in FIG. 1, omitting elements 2d and 2e in the drawing for simplification. The gradient coil elements 2a to 2c are formed on a substrate 4. In the coil system comprising a plurality of coil elements, called a "multi-filar" type, gradient amplifiers with great power are not required since total intensity of the gradient field produced by the coil system is shared by each of the coil elements.

However, the multi-filar gradient coil system shown in FIG. 2A has complicated coil patterns and it may take a long time to manufacture it especially when the coil patterns are hand-wired.

Further, in the coil system shown in FIG. 2A, lead portions 5 to respectively transmit power therethrough from the gradient amplifiers 3a to 3c to the gradient coil elements 2a to 2c cross the coil turns of the coil elements 2a to 2c. This may also make the manufacturing process of the system complicated when the coil patterns are formed either by hand-wiring or etching.

Especially in manufacturing the coil system shown in FIG. 2A by etching, a further problem may arise. FIG. 2B shows a cross section along the line B—B in FIG. 2A. It is necessary that the pitch between the adjacent coil turns be small such that a large number of coil elements can be formed on the substrate 4, while each turn of the coil is required to have a predetermined cross-sectional area (width B×height H) to conduct a predetermined intensity of current. For example, the height H is 2 mm when the width B is 12 mm and the pitch P is 2 mm. On the other hand, when the height of an etched conductor is too large, the problem of "under-etching", which causes some undesirable conductors to remain nearby an etched conductor, may occur. It may be difficult to keep the desired pitch P and may cause the coil pattern to short-circuit.

Therefore, a limited number of coil elements can be formed on the substrate 4.

Further, when the width B of a conductor line of a coil is small, the conductor must have a large cross-sectional area, even larger than an area sufficient to conduct a predetermined intensity of current, to keep a predetermined heat-radiation efficiency since the surface area substantially effective to radiate the heat from the conductor line is small. A cooling device for the gradient coil unit, for example, a water-cooling system, may be required.

Furthermore, when a shield coil is provided outside the gradient coil as disclosed in U.S. Pat. No. 4,733,189, issued Mar. 22, 1988 to Punchard et al. and the shield coil is formed in multi-filar type, the same problems as stated above may occur.

Furthermore, when a large number of shim coils for minimizing the inhomogeneity of the static magnetic field are provided inside a magnet to obtain a precise image, the same problems as stated above may occur.

SUMMARY OF THE INVENTION

An object of the present invention is to provide an improved MRI apparatus comprising a gradient coil system for producing a gradient field.

Another object of the present invention is to provide an improved gradient coil system for producing a gradient field.

A further object of the present invention is to provide an improved MRI apparatus comprising a shield coil for shielding a gradient field outside a gradient coil.

A further object of the present invention is to provide an improved MRI apparatus comprising a shim coil for minimizing the inhomogeneity of the static magnetic field.

According to the present invention, there is provided an MRI apparatus comprising:
  magnet means for producing a static magnetic field along a predetermined axis;
  radio-frequency means for transmitting a radio-frequency pulse and for receiving a magnetic resonance signal induced from an object; and
  gradient means for producing a gradient magnetic field, comprising a plurality of coil elements, wherein the coil elements are superposed one on another along a direction orthogonal to the axis and each of the coil elements for producing a gradient magnetic field along a common direction.

According to the present invention, there is provided a gradient coil system for producing a gradient magnetic field superimposed on a static magnetic field along a predetermined axis, comprising:
  a plurality of coil elements wherein the coil elements are superposed one on another along a direction orthogonal to the axis and each of the coil elements for producing a gradient magnetic field along a common direction.

According to the present invention, there is also provided an MRI apparatus comprising:

magnet means for producing a static magnetic field along a predetermined axis;

radio-frequency means for transmitting a radio-frequency pulse and receiving a magnetic resonance signal induced from an object;

gradient means for producing a gradient magnetic field; and shield means for shielding the gradient magnetic field outside the gradient means, the shield means comprising a plurality of shield coil elements, wherein the shield coil elements are superposed one on another along a direction orthogonal to the axis and each of the shield coil elements for producing a shielding magnetic field along a common direction.

According to the present invention, there is also provided an MRI apparatus comprising:

magnet means for producing a static magnetic field along a predetermined axis;

radio-frequency means for transmitting a radio-frequency pulse and receiving a magnetic resonance signal induced from an object;

gradient means for producing a gradient magnetic field; and shim means for producing a shimming magnetic field to minimize an inhomogeneity of the static magnetic field, the shim means comprising a plurality of shim coil elements, wherein the shim coil elements are superposed one on another along a direction orthogonal to the axis.

BRIEF DESCRIPTION OF THE DRAWINGS

For a more complete understanding of the present invention, reference will be made to the following detailed explanations in conjunction with the accompanying drawings in which.

DESCRIPTION OF THE PREFERRED EMBODIMENTS

Figure 3A:
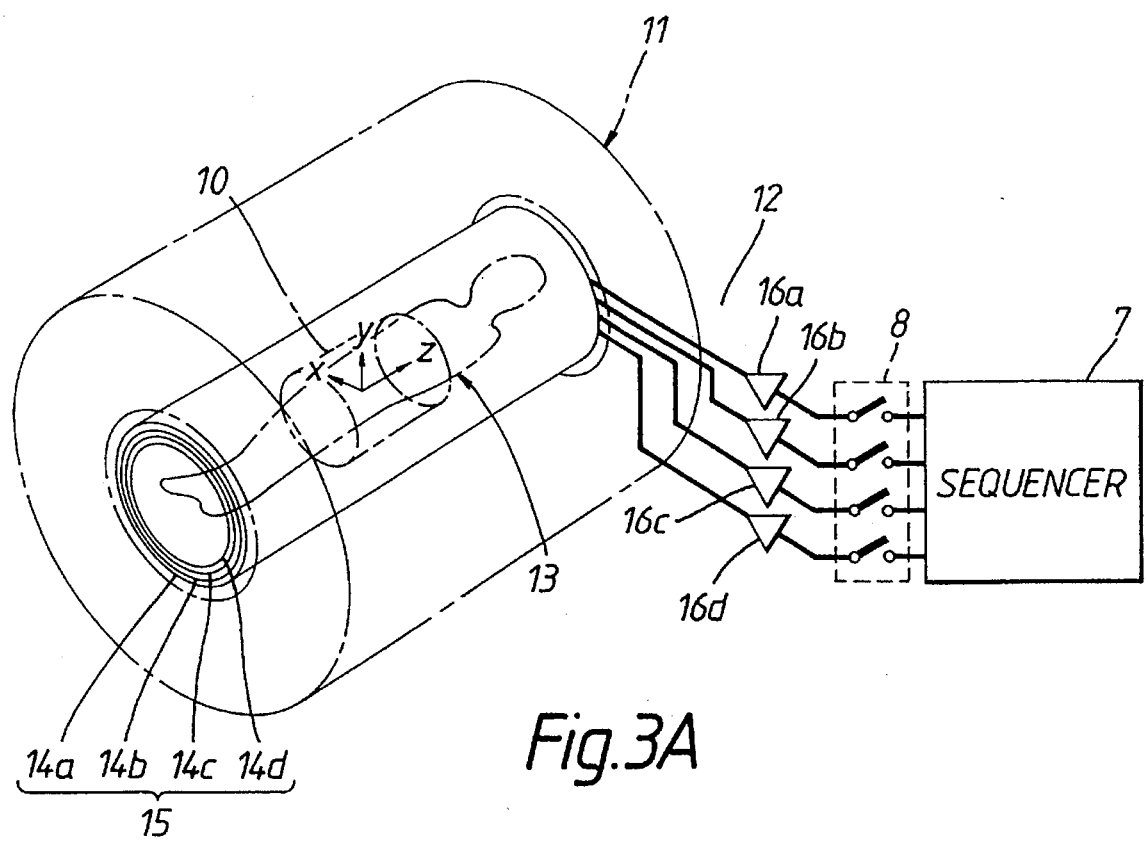
FIG. 3A is a perspective view of an MRI apparatus having a gradient coil system of a first embodiment of the present invention.

Referring now to FIG. 3A, a first embodiment of an MRI apparatus of the present invention will be described below.

The MRI apparatus comprises a magnet 11 for applying a static magnetic field along the z-axis, a gradient coil system 12 for applying a gradient magnetic field which is superimposed on the static magnetic field and an RF coil 10 for transmitting a radio-frequency pulse and receiving a magnetic resonance signal. The magnet 11 applies the static magnetic field to a region in which an object body 13 is placed and comprises a superconductive magnet. The superconductive magnet may be replaced by a permanent magnet or a resistive magnet. Transmitting a pulse and receiving a signal may be performed by a transmitter coil and a receiver coil, respectively.

The gradient coil system 12 comprises a gradient coil unit 15 including four cylindrical coil elements 14a to 14d, which are superposed coaxially, and gradient amplifiers 16a to 16d for supplying electrical power in the form of pulse currents respectively to the coil elements 14a to 14d. The gradient amplifiers 16a to 16d are controlled by a sequencer 7, which is programmable to perform a plurality of predetermined pulse sequences, to perform a common pulse sequence. A switch 8 is disposed between the gradient amplifiers 16a to 16d and the sequencer 7 to select the number of gradient coil elements in action. The number of activated elements is selected according to the pulse sequence, for example, only one element for a conventional spin-echo imaging or four for a rapid imaging such as an echo planar imaging.

Figure 3B:
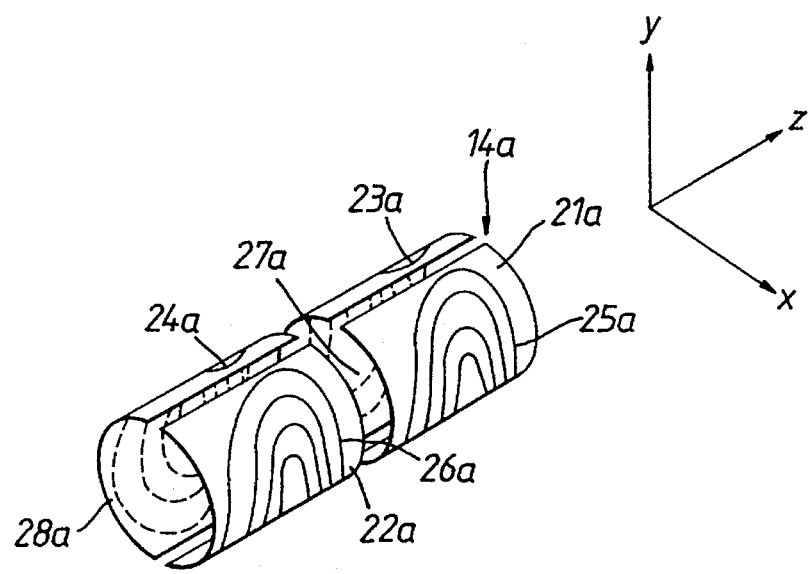
FIG. 3B is a perspective view of a gradient coil element according to the first embodiment of the present invention.

FIG. 3B shows the external coil element 14a. As shown in FIG. 3B, the coil element 14a for producing a gradient field along the x-direction comprises four coil patterns 25a to 28a formed on substrates 21a to 24a, respectively. The coils 25a to 28a are rolled into a cylindrical shape, with the coils 25a and 27a, and 26a and 28a respectively confronting each other. The general structures of the coil elements 14b to 14d are similar to that illustrated for the coil element 14a.

Figure 1:
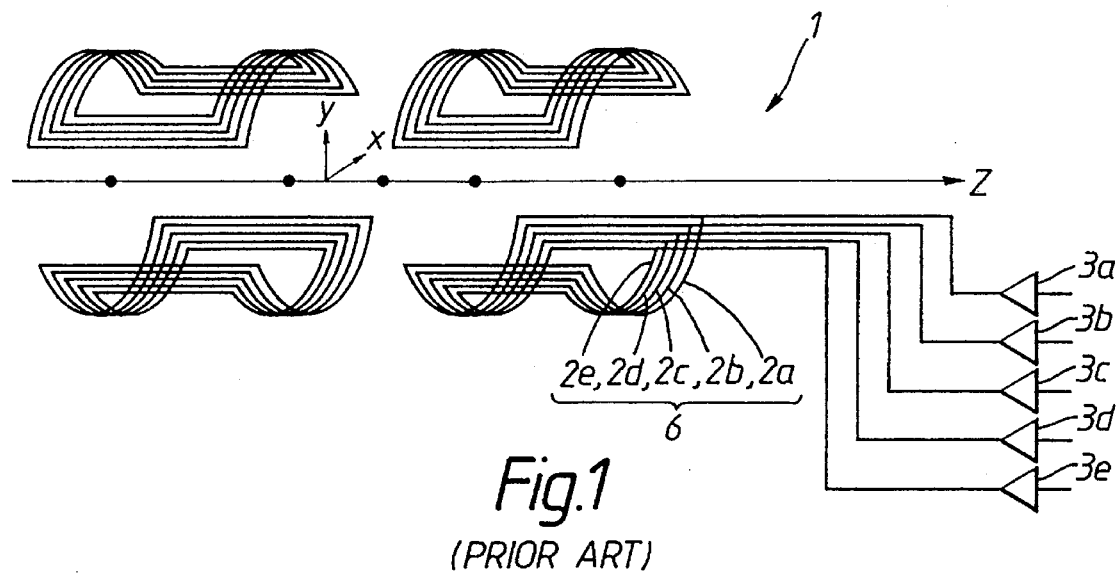
FIG. 1 illustrates a gradient coil system of the prior art.
Figure 4A:
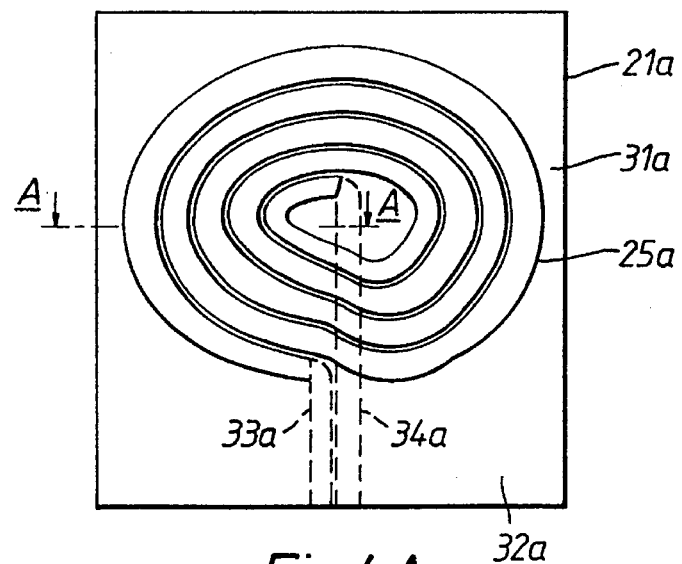
FIG. 4A is an developed view of a coil element of the coil system shown in FIG. 3.
Figure 4B:
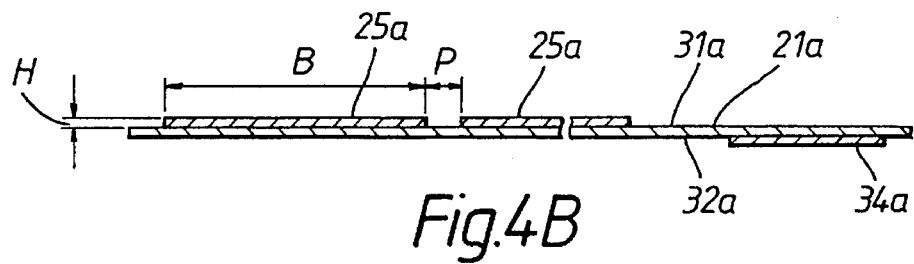
FIG. 4B shows section A—A of FIG. 4A.

FIG. 4A shows a developed view of the substrate 21a and the coil 25a and FIG. 4B shows a local sectional view along the line A—A in FIG. 4A. The coil element 14a comprises a coil pattern 25a formed on one surface 31a of the substrate 21a and lead portions 33a and 34a on the opposite surface 32a. The coil pattern 25a and the lead portions 33a and 34a consist of conductive materials, such as copper. The substrate 21a consists of non-conductive material, such as fiber reinforced plastics. Both ends of the coil pattern 25a are electrically connected to the lead portions 33a and 34a, respectively. The lead portion 33a may be formed on the same surface as the coil pattern 25a since the lead portion 33a can be formed not to cross the coil pattern 25a. The conductor line of the coil pattern 25a is disposed at a width B, a height H and a pitch P. On the other substrates 22a, 23a and 24a, coil patterns and lead portions are formed in a similar manner as on the substrate 21a although not shown in the figure. Each of the coil elements 14b to 14d has the similar structure as the coil elements 14a and is not explained in detail.

Figure 5A:
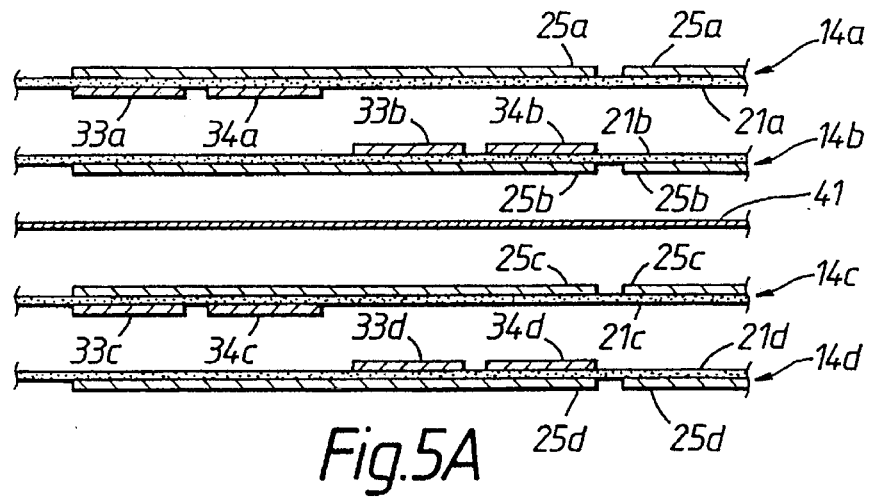
FIGS. 5A and 5B are sectional views of plurality of the coil elements.
Figure 5B:
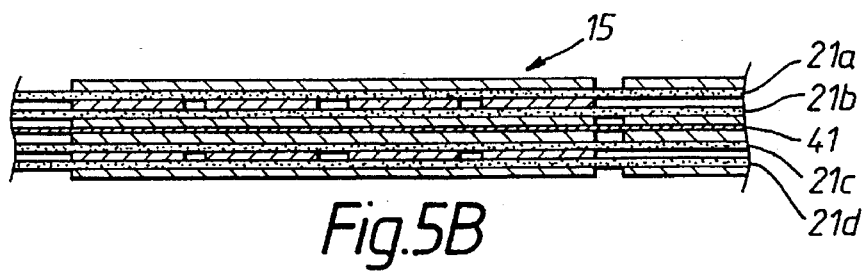

FIG. 5A shows the coil elements 14a to 14d before superposing and FIG. 5B shows the gradient coil unit 15 comprising the coil elements 14a to 14d superposed to each other along the radial direction.

As described above, the coil patterns 25a to 25d are respectively formed on one side of each of the substrates 21a to 21d. On the other sides of the substrates 21a to 21d, lead portions 33a and 34a, 33b and 34b, 33c and 34c and 33d and 34d are respectively formed. The coil patterns 25a to 25d of the coil elements 14a to 14d are shaped to substantially coincide with each other when they are superposed.

The coil elements 14a and 14b are superposed such that the surface with the lead portions 33a and 34a confront the surface with the lead portions 33b and 34b. Each lead portion is positioned not to contact the other lead portions on the confronting surface. The coil elements 14c and 14d are superposed such that the surface with the lead portions 33c and 34c confront the surface with the lead portions 33d and 34d in a similar manner as the elements 14a and 14b.

The coil elements 14b and 14c are superposed such that the surfaces, on which the coil patterns 25b and 25c are respectively formed, confront each other with an insulating layer 41 therebetween. The insulating layer 41 preferably consists of thermosetting plastics having high chemical and electrical resistance, such as Bakelite (trademark).

Figure 6:
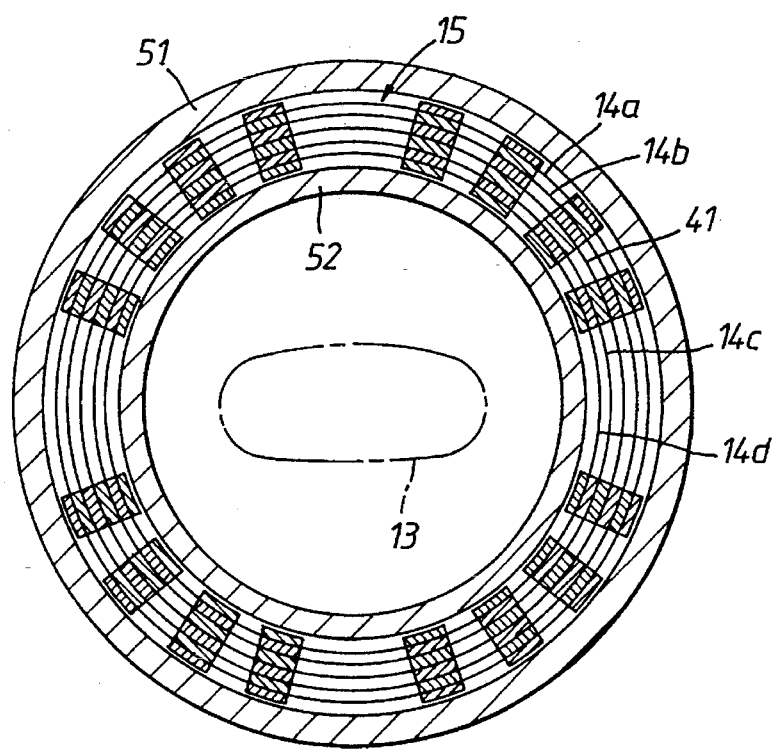
FIG. 6 is a sectional view of the gradient coil unit.

FIG. 6 shows the completed gradient coil unit 15 rolled around a core bobbin 52, inserted into a cylinder 51 and molded with, for example, a resin.

The process for manufacturing the gradient coil system of the first embodiment of the present invention will now be described.

Figure 7A:
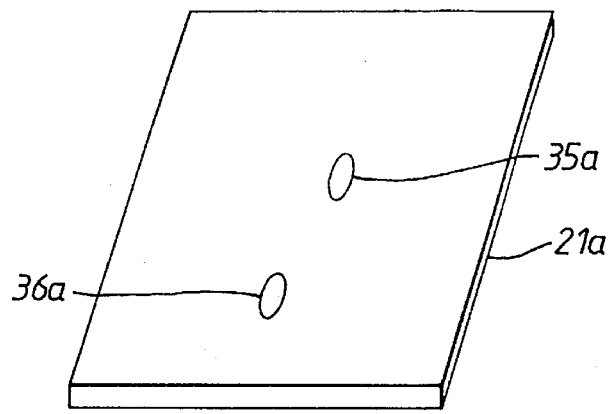
FIGS. 7A to 7C show a process for manufacturing one of the coil elements.
Figure 7B:
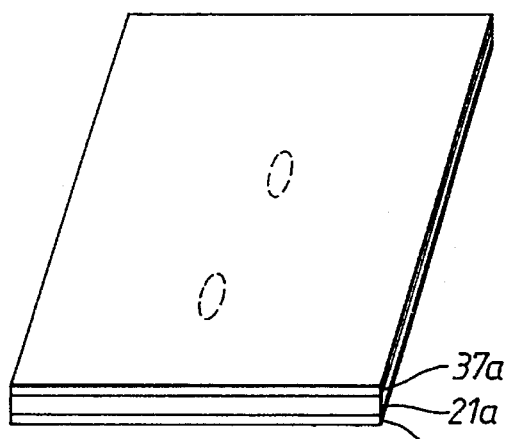
Figure 7C:
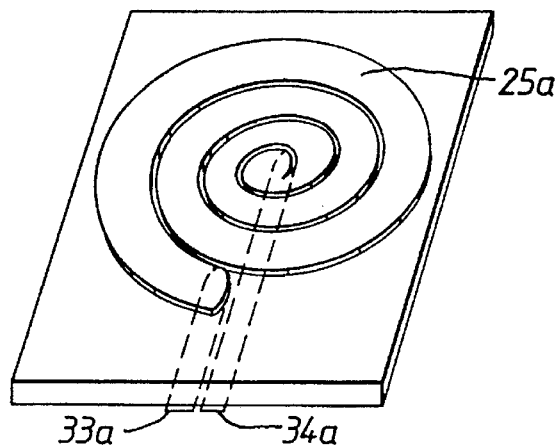

At the first step of manufacturing the gradient coil system, the coil pattern 25a is formed on the substrate 21a. Previously, two holes are provided in the substrate 21a and conductive materials 35a and 36a are respectively inserted in the holes extending from one surface to the opposite of the substrate 21a as shown in FIG. 7A. The holes are positioned to respectively coincide with the ends of the coil pattern 25a. Conductive layers 37a and 38a are formed on both surfaces of the substrate 21a as shown in FIG. 7B. Then, the conductor layers 37a and 38a are removed except for the coil pattern 35a on one side of the substrate 21a and the lead portions 33a and 34a on the other side by etching.

The coil pattern 25a is designed such that it is a desired pattern to conduct a predetermined surface current distribution when it is rolled into a cylindrical shape. The size of the sectional area of the coil 25a (width B, height H) is designed to be sufficient to conduct a desired intensity of current and to perform heat radiation.

Figure 2A:
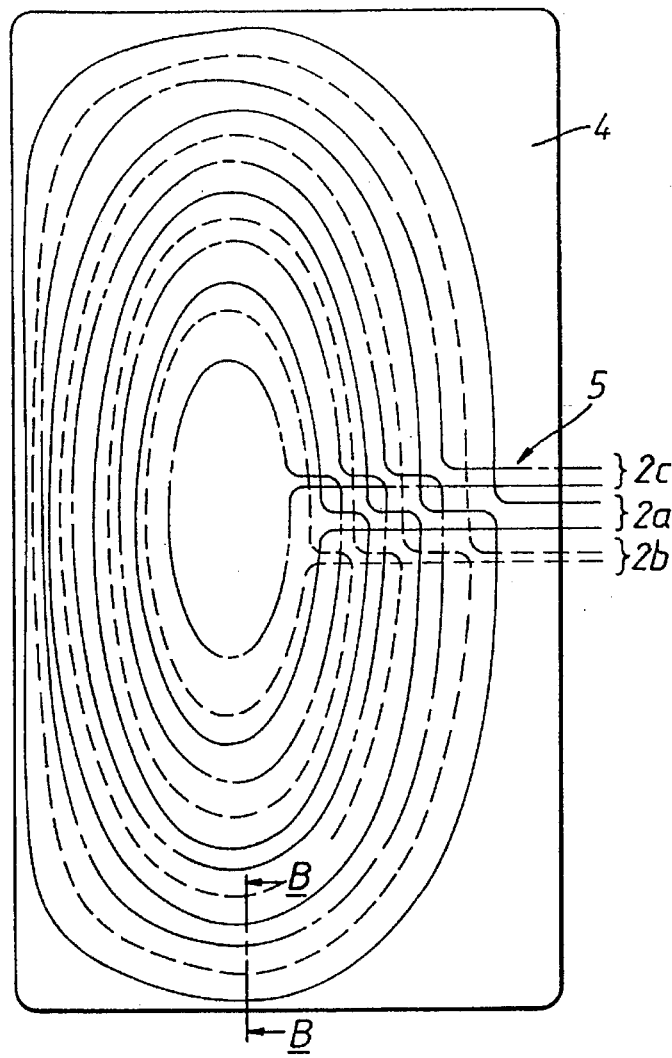
FIG. 2A is an developed view of a coil pattern of the prior art coil system shown in FIG. 1.
Figure 2B:
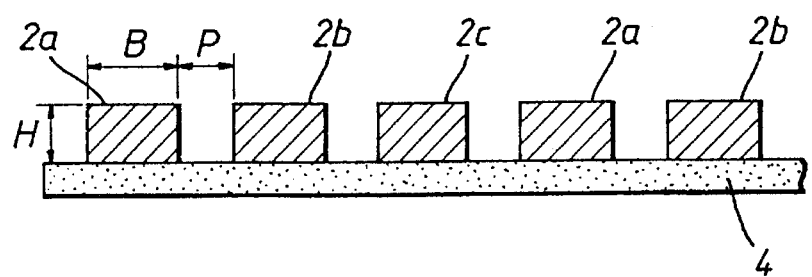
FIG. 2B shows section B—B of FIG. 2A.

Comparing with the prior art in which multi-filar coil patterns are formed on a common substrate, the width B of the conductor can be larger and the height H can be extremely smaller since on the substrate 21a only a single coil pattern 25a is formed. For example, the width B is 72 mm and the height H is 0.3 mm. Comparing the prior art shown in FIG. 2, the width is six times larger and the height is one sixth smaller.

Therefore, the under-etching problem does not arise substantially and the pitch P can be small. Further, the heat radiation efficiency is high since the surface area effective to radiate heat of the conductor is large. This enables the sectional area of the conductor to be smaller than that of the prior art. Only a simple cooling device or even no cooling device of the gradient coil system is necessary. Moreover, a large number of coil elements can be superposed since the height H of the conductor can be extremely small when the coil pattern is formed by a thin film technique, e.g. etching.

The lead portions 33a and 34a are formed on the opposite side to the coil pattern 25a by etching. The lead portions 33a and 34a are electrically connected to the ends of the coil patterns 25a through the conductive materials 35a and 36b, respectively. The lead portions 33a and 34a can be formed with large widths and small heights. Since the lead portions 33a and 34a and the coil pattern 25a are formed on the opposite sides of the substrate 21a, electrical insulation between them is not required and the coil element 14a can be easily manufactured.

Manufacturing the external coil element 14a is completed by forming the other coil patterns and lead portions on the substrates 22a to 24a in a similar manner.

Each of the coil elements 14b to 14d is manufactured by a similar process as for the coil element 14a. The shape of the coil pattern 25b on the internal coil element 14b is approximately the same as that of the coil element 14a, however, it is designed to have a smaller diameter when it is rolled cylindrically to be superposed coaxially inside the coil element 14a.

The coil elements 14d, 14c, the insulating layer 41, the coil elements 14b and 14a are rolled around a core-bobbin 52 (FIG. 6), composed of an insulating material, having a cylindrical shape from internal to external in this order. Since the sides on which the lead portions are formed confront each other such that a lead portion does not contact the others not to require an insulation member, the thickness of the superposed coil elements can be thin.

Next, the gradient coil unit 15 is inserted into a cylinder 51 (FIG. 6), composed of an insulating material, having the same longitudinal length as the gradient coil unit 15. Then, non-cured resin is poured to fill the space between the cylinder 51 and the core-bobbin 52 and then cured. This completes the manufacturing process of the gradient coil unit 15.

In the above-described embodiment, coil patterns 25a to 28a of the coil element 14a are respectively formed on individual substrates, however, they may be formed on a common substrate.

Further, in the first embodiment, the gradient coil unit comprises four coil elements, however, the number of the superposed elements is not limited to four and may be more or less than four. However, the greater the number of superposed elements, the less is the load on a single gradient amplifier.

In the above-described embodiment, the MRI apparatus produces an x-gradient field which is rapidly switched when, for example, a read gradient field is applied along the x-direction to perform echo planar imaging. This invention may, of course, be applied to the other, y- and/or z-, gradient coils to perform various imaging sequences or to obtain slice images at various angles. The X-, y- and z-gradient coil units are coaxially disposed.

Figure 8:
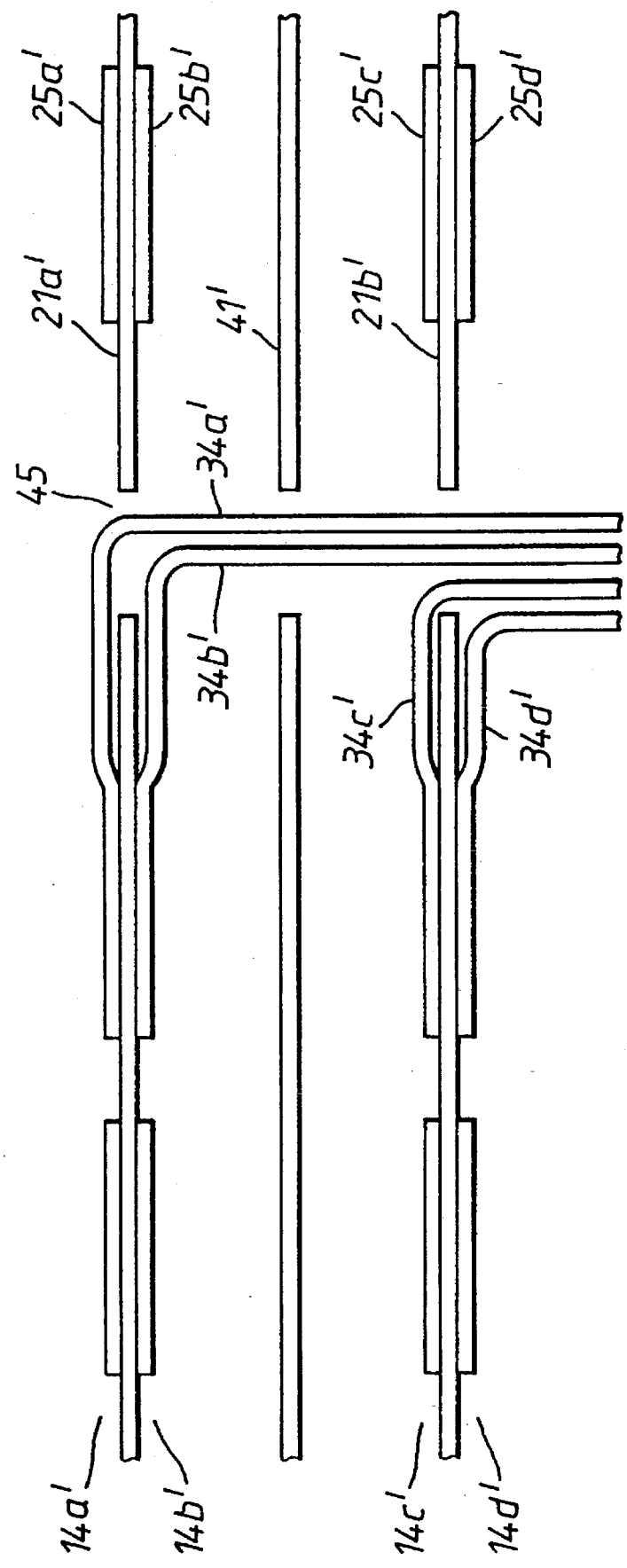
FIG. 8 shows a sectional view of the coil elements of the modified first embodiment.

The coil elements may be superposed in a manner other than that described above, while each of the coil elements is electrically insulated. For example, as disclosed in FIG. 8, coil patterns 25a' and 25b' of coil elements 14a' and 14b' are formed on both sides of a common substrate 21a', respectively, and coil patterns 25c' and 25d' of coil elements 14c' and 14d' are formed on both sides of a common substrate 21b', respectively. The substrates 21a' and 21b' are superposed with an insulating layer 41' therebetween. A hole 45 penetrates the substrates 21a' and 21b' and the insulating layer 41' at the centers thereof. Lead wires 34a' to 34d' pass through the hole 45 and are connected to gradient amplifiers (not shown). The total thickness of the gradient coil unit can be thinner than the above-described embodiment.

Coil patterns and the lead portions may also be formed by any thin film technique other than etching on substrates. For example, other chemical processes, e.g. plating, or machine manufacturing processes to mount a cut-out thin film conductor on an insulator substrate, e.g. laser-cutting method or stamping-out method, may be applied.

Figure 9:
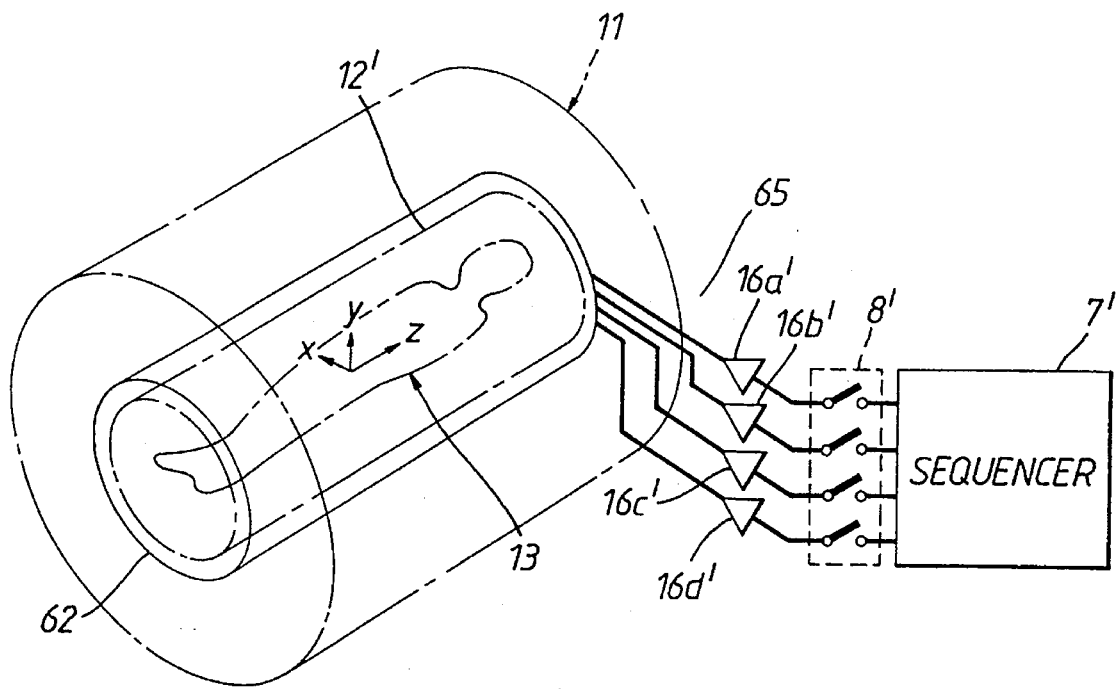
FIG. 9 is a perspective view of the second embodiment of the present invention applying shield coils.

Referring now to FIG. 9, a second embodiment of the present invention will be described. Components substantially the same as in the first embodiment have the same numerals and are not explained in detail.

A perspective view of an MRI apparatus of the second embodiment is shown in FIG. 9. A shield coil unit 62 is disposed between a magnet 11 and a gradient coil unit 12' for shielding the gradient field outside the gradient coil unit 12'. The gradient coil unit 12' includes a plurality of, e.g. four, gradient coil elements superposed radially (not shown). The shield coil unit 62 includes a plurality of shield coil elements superposed radially (not shown), each of which corresponds to each gradient coil element. Each of gradient coil elements and shield coil elements are electrically connected in series and pulse currents are supplied from gradient amplifiers 16a' to 16d', respectively. The shield coil unit 62 is approximately 100 mm larger than the gradient coil unit 12' in diameter. A sequencer 7' drives the gradient amplifiers 16a' to 16d' according to a predetermined pulse sequence.

When supplied a current with a predetermined intensity, the shield coil unit 62 produces a shield magnetic field having an opposite direction to the gradient magnetic field for cancelling a gradient field outside the gradient coil unit 12' to prevent eddy currents from occurring in a cylindrical conductive material for thermal shielding of a superconductive coil in the magnet 11. A switch 8' is disposed between the gradient amplifiers 16a' to 16d' and the sequencer 7' to select the number of pairs of the gradient coil elements and the shield coil elements in action.

The shield coil 65 is manufactured by superposing a plurality of coil elements in a similar manner as stated in the first embodiment. The manufacturing process and the function of the second embodiment will not be explained since they are substantially same as the first embodiment.

Figure 10:
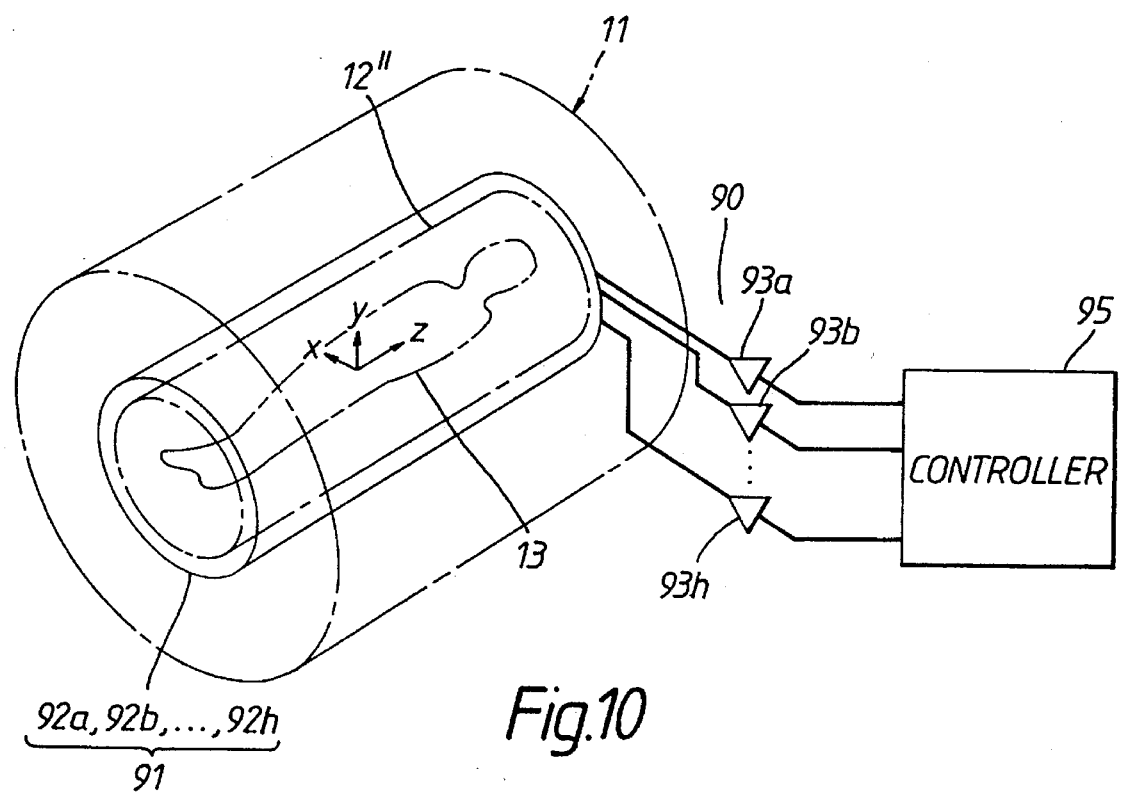
FIG. 10 is a perspective view of the third embodiment of the present invention applying shim coils.

Referring to FIG. 10, a third embodiment of the present invention will be described. Components substantially the same as in the first embodiment have the same numerals and are not explained in detail.

A perspective view of an MRI apparatus of the third embodiment is shown in FIG. 10. Shim coil system 90 is disposed between a magnet 11 and a gradient coil unit 15 for producing shimming magnetic fields to minimize the inhomogeneity of the static field. The shim coil system 90 comprises shim coil unit 91, shim amplifiers 93 and a controller 95. The shim coil unit 91 includes eight, for example, shim coil elements 92a to 92h respectively connected to the shim amplifiers 93a to 93h. The intensities of currents from the shim amplifiers 93 are controlled by a controller 95 so that the optimum homogeneity can be obtained for every object body.

Figure 11A:
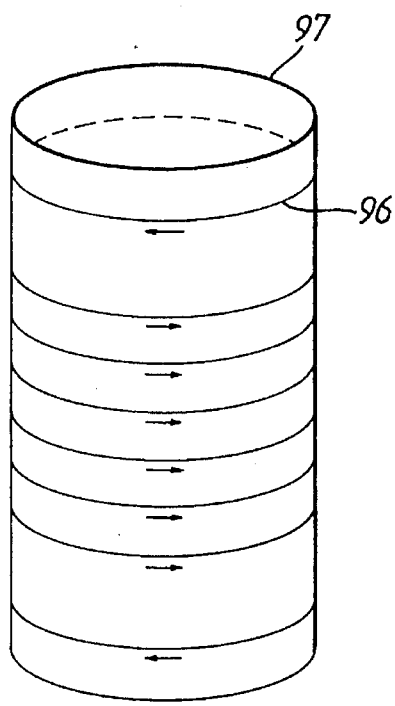
FIGS. 11A, 11B and 11C show examples of a shim coil element of the third embodiment.
Figure 11B:
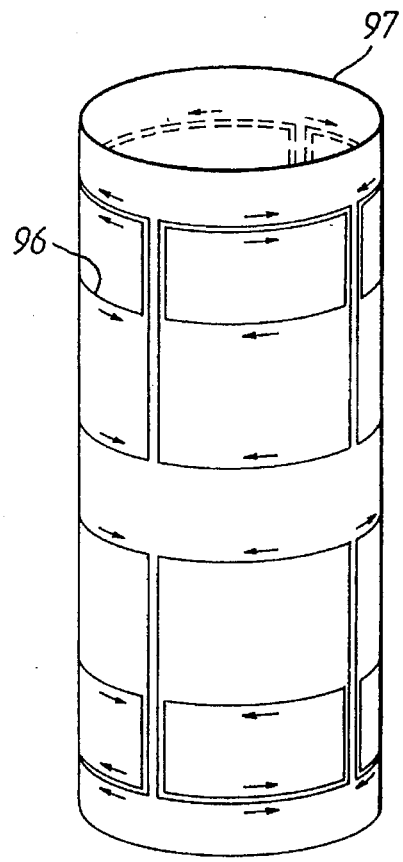
Figure 11C:
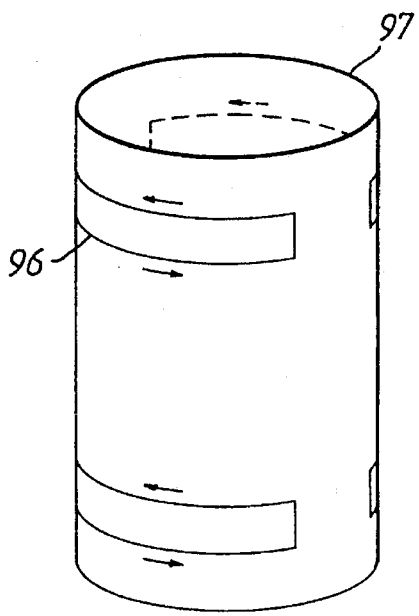

The static magnetic field can be indicated as a sum of a plurality of magnetic field components. Each of the shim coil elements produces a shimming magnetic field to minimize the inhomogeneity of the respective field component of the static field. FIGS. 11A to 11C show examples of the shim coil elements for three field components. FIGS. 11A, 11B and 11C show coil patterns for the field components of z, xy and zx, respectively. Each coil pattern 96 is etched on an outer surface of a cylindrical substrate 97 and lead portions (not shown) are etched on an inner surface thereof. Directions of currents in the shim coil patterns are indicated by arrows in the drawings. Eight shim coil elements 92a to 92h are superposed radially with insulating layers therebetween (not shown).

The number of the shim coil elements is not limited to that in the third embodiment. The greater the number of the field components, the less the inhomogeneity of the static field. Applying the present invention to shim coils as described above, the great number of shim coil elements can be manufactured in a thin and simple structure. The manufacturing process the third embodiment will not be explained since they are substantially same as the first embodiment.

The invention has been described in connection with certain illustrated embodiments. However, numerous modifications and variations of the present invention are possible in light of the above teachings. It is therefore to be understood that, within the scope of the appended claims, the present invention can be practiced in a manner other than as specifically described herein.

What is claimed is:

1. A magnetic resonance imaging apparatus comprising;

magnet means for producing a static magnetic field along a predetermined axis;

radio-frequency means for transmitting a radio-frequency pulse and for receiving a magnetic resonance signal induced from an object;

gradient means for producing a gradient magnetic field, the gradient means comprising a plurality of gradient coil elements superimposed on one another along a direction orthogonal to the predetermined axis and each gradient coil element capable of producing a gradient magnetic field along a common direction, wherein each of the gradient coil elements comprises:
a substrate;
a gradient coil pattern formed on a first surface of the substrate for producing the gradient magnetic field; and
a lead portion formed on a second surface of the substrate opposite to the first surface and connected to an end of the gradient coil pattern for supplying electrical power to the gradient coil pattern;
wherein the second surfaces of at least a pair of gradient coil elements confront each other, the lead portions respectively connected to the pair of gradient coil elements positioned in non-contacting relation; and shield means for shielding the gradient magnetic field outside the gradient means, the shield means comprising a plurality of shield coil elements superimposed on one another along a direction orthogonal to the predetermined axis and each of the plurality of shield coil elements capable of producing a shielding magnetic field along the common direction.

2. A gradient coil system for producing a gradient magnetic field superimposed on a static magnetic field along a predetermined axis, comprising:

a plurality of gradient coil elements superimposed on one another along a directional orthogonal to the predetermined axis, each of the gradient coil elements capable of producing a gradient magnetic field along a common direction, wherein each of the gradient coil elements comprises:
a substrate;
a gradient coil pattern formed on a first surface of the substrate for producing the gradient magnetic field; and
a lead portion formed on a second surface of the substrate opposite to the first surface and connected to the end of the coil pattern for supplying electrical power to the coil pattern;
wherein the second surfaces of at least a pair of gradient coil elements confront each other, the lead portions respectively connected to the pair of gradient coil elements positioned in a non-contact relation; and shield means for shielding the gradient magnetic field outside the gradient means, the shield means comprising a plurality of shield coil elements superimposed on one another along a direction orthogonal to the predetermined axis and each of the plurality of shield coil elements capable of producing a shielding magnetic field along a common direction.

3. The magnetic resonance imaging apparatus according to claim 1 wherein the gradient means includes:

a plurality of gradient amplifiers for respectively supplying electrical power to the gradient coil elements.

4. The magnetic resonance imaging apparatus according to claim 1 wherein each of the gradient coil elements is cylindrically-shaped.

5. The magnetic resonance imaging apparatus according to claim 4 wherein the gradient coil elements are radially superposed.

6. The magnetic resonance imaging apparatus according to claim 1 comprising a plurality of the gradient means producing gradient magnetic fields orthogonal to each other.

7. The magnetic resonance imaging apparatus according to claim 1 wherein the respective first surfaces of at least a pair of the gradient coil elements confront each other; and the gradient means further comprising insulating means disposed between the confronting first surfaces.

8. The magnetic resonance imaging apparatus according to claim 1 wherein the coil patterns of the gradient coil elements respectively have shapes which substantially coincide with each other.

9. The gradient coil system according to claim 2 wherein the first surfaces of the gradient coil elements confront each other; and the gradient means further comprising insulating means disposed between the confronting first surfaces.

10. The gradient coil system according to claim 2 wherein the shapes of the gradient coil patterns of the coil elements substantially coincide with each other.

* * * * *